(12) United States Patent
Chen et al.

(10) Patent No.: US 8,058,810 B2
(45) Date of Patent: Nov. 15, 2011

(54) METHOD AND SYSTEM FOR HIGH EFFICIENCY, FAST TRANSIENT MULTI-CHANNEL LED DRIVER

(75) Inventors: Min Chen, Milpitas, CA (US); Bryan Avery Legates, Los Altos Hills, CA (US)

(73) Assignee: Linear Technology Corporation, Milpitas, CA (US)

( * ) Notice: Subject to any disclaimer, the term of this patent is extended or adjusted under 35 U.S.C. 154(b) by 370 days.

(21) Appl. No.: 12/437,273

(22) Filed: May 7, 2009

(65) Prior Publication Data

US 2010/0283397 A1   Nov. 11, 2010

(51) Int. Cl.
*H05B 39/04* (2006.01)
(52) U.S. Cl. .............. 315/209 R; 315/307; 315/297; 315/224
(58) Field of Classification Search .......... 315/209 R, 315/210, 185 R, 186, 291, 294, 295, 297, 315/224, 307
See application file for complete search history.

(56) References Cited

U.S. PATENT DOCUMENTS

| | | | | |
|---|---|---|---|---|
| 7,723,926 | B2 * | 5/2010 | Mednik et al. | 315/291 |
| 7,843,148 | B2 * | 11/2010 | Gater et al. | 315/291 |
| 7,902,771 | B2 * | 3/2011 | Shteynberg et al. | 315/307 |
| 7,948,468 | B2 * | 5/2011 | Zane et al. | 345/102 |
| 2007/0091036 | A1 | 4/2007 | Han et al. | |

FOREIGN PATENT DOCUMENTS

| | | |
|---|---|---|
| DE | 10-2007-004877 A1 | 8/2008 |
| EP | 1 499 165 A2 | 1/2005 |
| WO | WO 2007/055519 A1 | 5/2007 |

OTHER PUBLICATIONS

European Search Report issued in European Patent Application No. 10004814.9-2215, mailed Jul. 30, 2010.

* cited by examiner

*Primary Examiner* — Don Le
(74) *Attorney, Agent, or Firm* — McDermott Will & Emery LLP

(57) ABSTRACT

System and method for a light emitting diode (LED) driver are disclosed. To supply an LED bus voltage to a large array of LEDs organized in multiple channels where one or more LEDs are connected in series in each channel, an LED driver includes a power converter, a feedback generation circuit, and a phase-division based controller. The power converter is configured for providing the LED bus voltage to the multiple LED channels based on a voltage control signal. The feedback generation circuit is configured for generating a feedback signal based on the LED bus voltage supplied to the multiple LED channels. The phase-division based controller is configured for generating the voltage control signal based on the feedback signal and information from the multiple LED channels. The phase-division based controller divides each pulse width modulation (PWM) of each channel into a tracking phase and a pre-charging phase so that the LED bus voltage supplied to the multiple channels changes between the tracking phase and the pre-charging phase.

17 Claims, 10 Drawing Sheets

METHOD AND SYSTEM FOR HIGH EFFICIENCY, FAST TRANSIENT MULTI-CHANNEL LED DRIVER

BACKGROUND

1. Technical Field

The present teaching relates to method and system in connection with light emitting diode (LED) and systems incorporating the same. More specifically, the present teaching relates to method and system for LED driver and systems incorporating the same.

2. Discussion of Technical Background

The emergence of high brightness light emitting diodes (LEDs) has led the conventional lighting world into a new era of solid state lighting. High optical efficiency, long operating lifetime, wide operating temperature range, and environmental friendliness are some key features in favor of LED technology over incandescent or fluorescent solutions. While uniformly-controlled LEDs dominate in high performance LCD backlighting, a large array of individually-modulated LEDs is increasingly finding new applications in dynamic LCD backlighting and LED display. Due to manufacturing variations in forward voltage drop, luminous flux output, and peak wavelength, however, these applications require either binning strategy with the penalty of low yield and high cost, or better circuit enhancement techniques other than a simple resistor based solution.

Powered by an individually-modulated multi-channel driver, a large array of LEDs can be divided into multiple channels with one or more LEDs connected in series per channel. Each channel requires individual dot correction current adjustment and individual grayscale pulse width modulation (PWM) dimming. The dot correction current adjustment calibrates the brightness deviation between channels, and the grayscale PWM dimming controls the brightness without any color shift.

To achieve a better performance, PWM dimming signals are synchronized to the same frequency with no phase shift between rising edges. In addition to these essential functions, two measures, namely system efficiency and minimum LED on time, aim at further evaluating the performance of such an individually-modulated multi-channel LED driver. The system efficiency is defined as the total LED output power divided by the total input power. Thus, a lower level of power dissipation across the LED driver increases the system efficiency. The minimum LED on time is measured based on the time interval from the beginning of a PWM rising edge to the time when the LED current reaches a regulated level. Therefore, a shorter minimum LED on time corresponds to a faster response time and a higher contrast ratio, which is desirable in high performance display applications.

Various circuits based on switching regulators have been developed to drive a single channel of series LEDs with high efficiencies. FIG. 1 (Prior Art) shows application of such techniques being applied to multiple channels of LEDs. Circuit 100 comprises an input voltage 105 being supplied to multiple channels 110, 130, . . . , 150. Each channel includes a single channel switching LED driver, e.g., 120, 140, . . . , 160, and associated components such as serially connected diodes (115-*a* to 115-*b*, 135-*a* to 135-*b*, . . . , and 155-*a* to 155-*b*) and a capacitor (125, 145, . . . , 165).

This type of separate architecture as shown in FIG. 1 is not always warranted because of dedicated switching circuitry and passive components (i.e., inductors and capacitors) for each channel. At the same time, slow transient response inherent to switching regulators, caused by slewing inductor current, charging capacitor voltage, and limited switching frequency, imposes a longer minimum LED on time ranging from several to tens of microseconds.

Efforts have been made to address such problems. FIGS. 2 and 3 (Prior Art) illustrate two of such solutions based on a parallel architecture, in which a single power converter is combined with multiple linear current sinks. Such a parallel architecture eliminates the need for dedicated complex switching circuitry and external passive components for each channel, and replaces them with simplified linear circuitry. The single power converter, in a form of inductor, capacitor, or transformer based voltage regulator, converts a wide range of input voltage to a single LED bus voltage which is supplied to all channels. Each current sink regulates and modulates its current to the desired current adjustment and PWM dimming setting. At the same time, the current sink absorbs the extra voltage drop equal to the LED bus voltage minus the practical LED forward voltage drop.

The first parallel solution, as shown in FIG. 2 (Prior Art), adopts an independent power converter 205. The output LED bus voltage 255 is regulated to a preset constant value independent of the dynamics of all LED channels. This prior art circuit 200 comprises an independent power converter 205, a resistor divider network 210, a bulk output capacitor 225, and a plurality of parallel channels. Each of the parallel channels includes a corresponding linear current sink (230, 250, . . . , 270) connected to the output LED bus voltage via serially connected diodes (230 via diodes 235 to 240, 250 via diodes 265 to 260, . . . , and 270 via diodes 285 to 280).

The output LED bus voltage is programmed through feedback resistors 215 and 220 to a preset constant value based on worst-case LED forward voltage drops across temperature, current, and manufacturing variations. Since the LED bus voltage is set high enough at the rising edge of each PWM signal, the response time to inject inductor current and to charge capacitor voltage is no longer necessary. Therefore, the minimum LED on time is only limited by the transient response of the linear current sink, which is usually much faster, ranging from tens to hundreds of nanoseconds. Such a shorter minimum LED on time leads to a faster response time and a higher contrast ratio. However, strong temperature coefficient and current dependence coupled with immature manufacturing technology cause large variations in LED forward voltage drop, leading to higher power dissipation and lower system efficiency. Although LED binning strategy can improve system efficiency by reducing the LED forward voltage variations, this drives up the cost.

The second parallel solution, as shown in FIG. 3 (Prior Art), adopts an adaptive power converter 305. In this prior art circuit 300, instead of a preset constant value, the output LED bus voltage 355 is tracked to a minimum value required to maintain all active LED channels in regulation on the fly. The prior art circuit 300 comprises also multiple channels, each of which has a corresponding current sink (330, 350, . . . , 370) connected to the output LED bus voltage 355 via serially connected diodes (330 via 340 to 335, 350 via 365 to 360, . . . , and 370 via 385 to 380). In addition, circuit 300 also includes a detector 310 that detects the minimum LED voltage among $V_{LED1}$ to $V_{LEDn}$ and sends such detected result to the adaptive power converter 305.

At the beginning of each PWM dimming cycle, the majority of LED channels, if not all, are turned on and thus the LED bus voltage is regulated to its highest value. As subsequent worst-case LED channels are turned off gradually, the detector 310 tracks the minimum LED voltage and sends such detection result to the power converter 305, which adapts the LED bus voltage to a lower value and still keeps the remaining active LED channels in regulation without wasting any extra unnecessary power. This adaptive tracking LED bus voltage improves system efficiency by removing unnecessary power dissipation across the current sinks. However, the LED bus voltage may reach its lowest value just before the next PWM dimming cycle, right before the majority LED channels will be turned on again. When this occurs, the LED bus voltage is not high enough to keep all the active LED channels in regulation, and the minimum LED on time can be greatly increased to accommodate the slow transient response of the switching power converter charging the output capacitor to its highest value.

SUMMARY OF THE PRESENT TEACHING

The present teaching relates to methods and apparatus for a light emitting diode (LED) driver that supplies an LED bus voltage to a large array of LEDs organized in multiple channels with one or more LEDs connected in series in each channel. The present teaching relates also to methods and systems that incorporate an LED driver or method thereof as disclosed herein.

In one aspect of the present teaching, an apparatus of an LED driver is disclosed in order to supply an LED bus voltage to a large array of LEDs organized in multiple channels with one or more LEDs connected in series in each channel. In accordance with the present teaching disclosed herein, an exemplary LED driver includes a power converter that is designed for providing the LED bus voltage to the multiple LED channels based on a voltage control signal. The LED driver also includes a feedback generation circuit configured for generating a feedback signal based on the LED bus voltage supplied to the multiple LED channels. Furthermore, the LED driver includes a phase-division based controller provided for generating the voltage control signal based on the feedback signal and information from the multiple LED channels. The phase-division based controller divides each pulse width modulation (PWM) dimming cycle associated with each channel into a tracking phase and a pre-charging phase so that the LED bus voltage supplied to the multiple channels changes between the tracking phase and the pre-charging phase.

In another aspect of the present teaching, a method for an LED driver as discussed herein is disclosed. In accordance with the present teaching, LED bus voltage is supplied to the multiple LED channels based on a voltage control signal, that is generated based on a feedback signal and information from the multiple channels. The feedback signal is generated based on the LED bus voltage supplied to the multiple channels. The LED bus voltage provided to the multiple channels differs in value between a tracking phase and a pre-charging phase, which are divided with respect to each pulse width modulation (PWM) dimming cycle associated with each channel.

In yet another aspect of the present teaching, a communication device having an LED display disclosed as driven by an LED driver, which supplies an LED bus voltage is supplied to the multiple LED channels based on a voltage control signal. The supplied LED bus voltage is used to generate a feedback signal and the voltage control signal is generated based on the feedback signal and other information from the multiple channels. The LED bus voltage provided to the multiple channels differs in value between a tracking phase and a pre-charging phase, which are derived by dividing each pulse width modulation (PWM) dimming cycle associated with each channel.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DETAILED DESCRIPTION

The present teaching relates to light emitting diode (LED) driver circuitry in general. More specifically, the present teaching relates to highly efficient, fast transient individually-modulated multi-channel LED drivers and applicable to LCD dynamic LED backlighting or mono-, multi-, full-color LED display applications.

Figure 4:
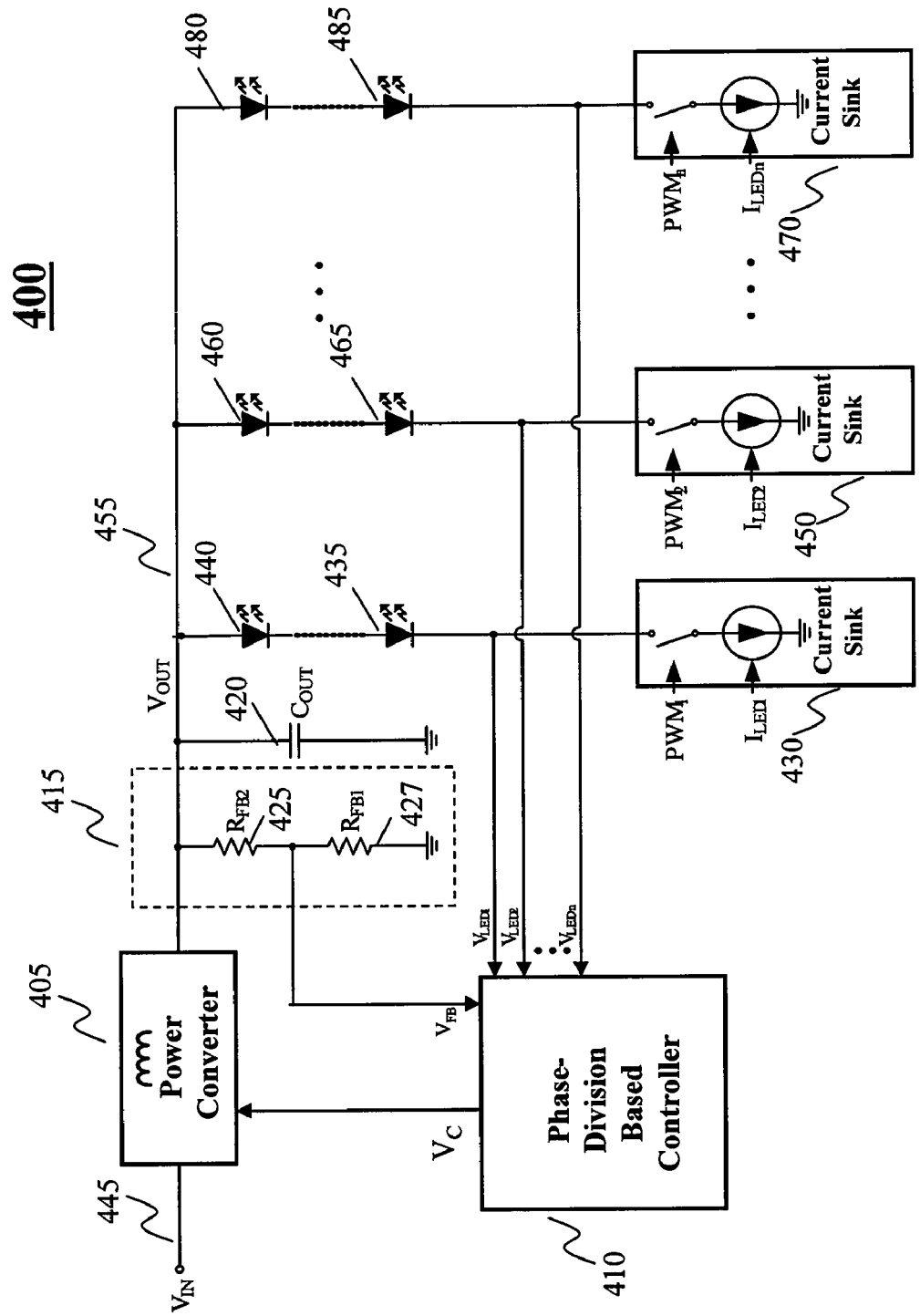
FIG. 4 depicts an exemplary system employing circuits to implement a tracking and a pre-charging phase to drive multiple channels of LEDs, in accordance with an embodiment of the present teaching.

The present teaching herein discloses a multi-channel LED driver that has high efficiency and fast transient response, suitable for LEDs having a wide range of forward voltage variations. In FIG. 4, an exemplary circuit 400 constructed based on a parallel architecture is shown. The exemplary circuit 400 comprises a power converter 405, a phase-division based controller 410, a feedback generation circuit 415, a bulk output capacitor 420, and a plurality of individual LED channels. Each of the parallel channels comprises an independent current sink (430, 450, . . . , 470) connected to the output LED bus voltage 455 via serially connected diodes (430 via diodes 435 to 440, 450 via diodes 465 to 460, . . . , and 470 via diodes 485 to 480). The feedback generation circuit 415 comprises two serially connected resistors 425 and 427 to generate a feedback signal $V_{FB}$. The $V_{FB}$ signal, as well as the signals $V_{LED1}$ to $V_{LEDn}$ from each current sink, is fed to the phase-division based controller 410.

In operation, the phase-division based controller 410 divides any PWM dimming cycle into two phases, namely a tracking phase and a pre-charging phase. During the tracking phase, the LED bus voltage 455 is adaptively regulated to a minimum value required to keep all active LED channels in regulation, thereby achieving high system efficiency. During the pre-charging phase, which usually corresponds to the last small fraction/portion of a PWM dimming cycle, the LED bus voltage 455 is regulated towards a preset constant value programmed by the feedback generation circuit 415. The phase-division based controller 410 generates the two different phases by a preset or custom setting and reacts accordingly to control the power converter to achieve such goals. By setting the pre-charging phase time interval to be larger than the slow transient response time of the switching power converter 405, the operation of the circuit 400 ensures a short minimum LED on time. The details of how the circuitry 400 produces enhanced performance are explained below with reference to subsequent figures.

Figure 5:
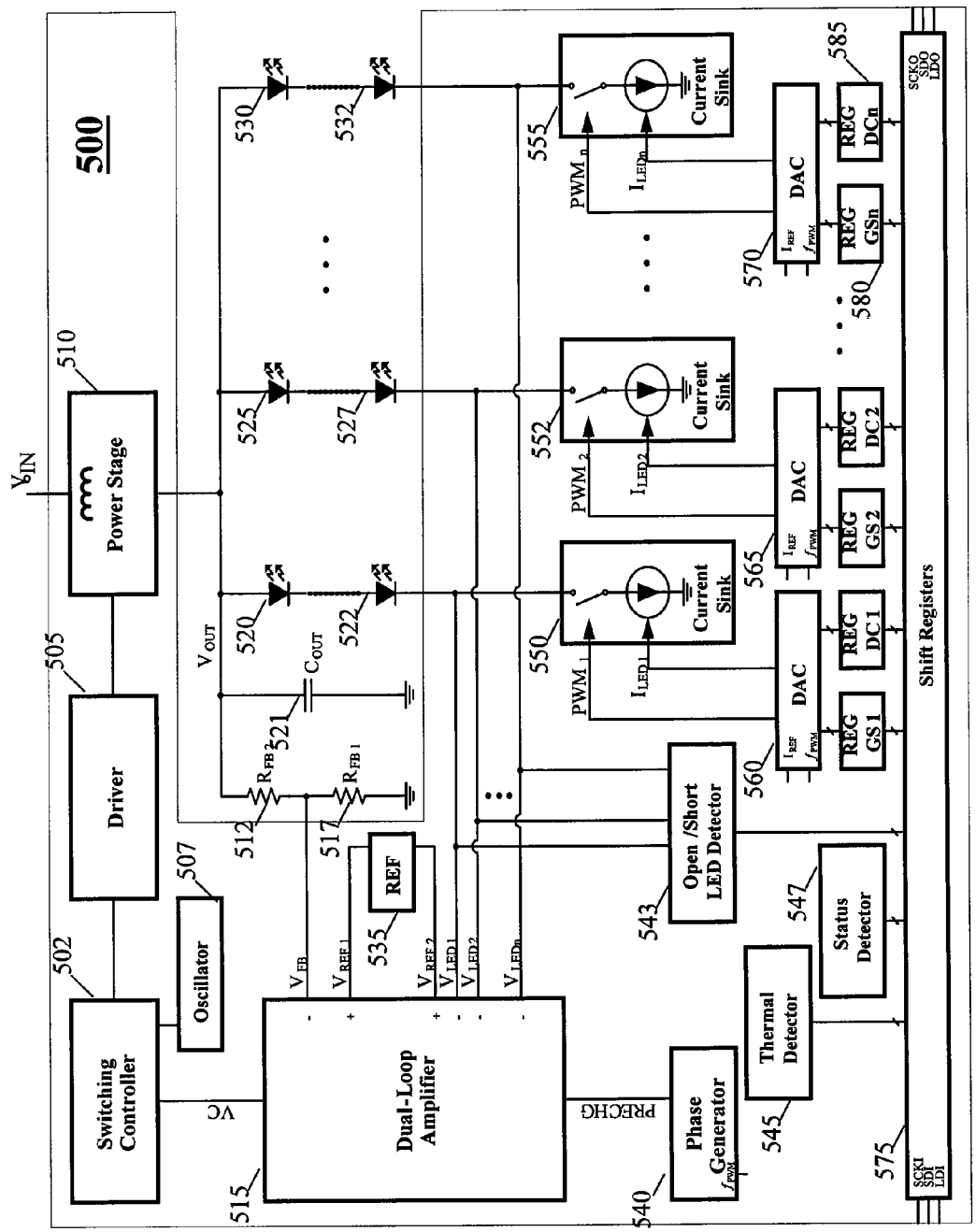
FIG. 5 depicts an exemplary circuit for a multi-channel LED driver; in accordance with an embodiment of the present teaching.

FIG. 5 depicts a more detailed exemplary multi-channel LED driver circuitry 500 in connection with the circuit 400 in FIG. 4. Specifically, in the illustrated embodiment in FIG. 5, the power converter 405 (in FIG. 4) is implemented based on a switching controller 502, an oscillator 507, a driver 505, and a power stage 510. The phase-division based controller 410 in FIG. 4 may be implemented to include a dual-loop amplifier 515, a reference voltage generator 535, and a phase generator 540. The feedback generation circuit 415 in FIG. 4 is implemented in similar manner to include two serially connected resistors 512 and 517.

In the more detailed exemplary multi-channel LED driver circuitry 500, it also includes other house-keeping types of additional circuitries. For example, a chain of shift registers 575, internal dot correction registers (REG DC1 to REG DCn) and grayscale registers (REG GS1 to REG GSn) that are programmed by the chain of registers 575, and corresponding digital to analog converters (DACs) 560, 565, . . . , 570. In addition, the house-keeping circuitry may also include a thermal detector 545, an open/short LED detector 543, and a status detector 547. These functional blocks, together with the power converter 405 and the phase-division based controller 410 may be implemented in the same single chip as other blocks to enhance the versatility of the multi-channel LED driver 500.

In operation, the circuitry 500 is capable of converting a wide range of input voltage $V_{IN}$ to a single LED bus voltage $V_{OUT}$ through an inductor-, capacitor-, or transformer-based power stage 510, the choice of which is determined based on different parameters, including, but not limited to, e.g., the input/output voltage ratio, voltage polarity, loading condition, circuit complexity, efficiency consideration, isolation requirement, etc. The LED bus voltage $V_{OUT}$ is supplied to the multiple parallel LED channels (520, 522, 550, 525, 527, 552, . . . , 530, 532, 555) having a common anode connection to $V_{OUT}$. Individual cathodes in different channels are connected to their corresponding individual current sinks. For example, current sink 550 is connected to the cathode of diode 522, which is serially coupled to diode 520, whose anode is connected to the LED bus voltage $V_{OUT}$. Similarly, current sink 552 is connected to the cathode of diode 527, which is serially coupled to diode 525, whose anode is connected to the LED bus voltage $V_{OUT}$. Current sink 555 is connected to the cathode of diode 532, which is serially coupled to diode 530, whose anode is connected to the LED bus voltage $V_{OUT}$.

The bulk output capacitor $C_{OUT}$ 521 between $V_{OUT}$ and the ground filters the output voltage ripple caused by the power stage switching activities. The capacitor 521 also provides temporary energy to satisfy load transients, and stabilizes the internal control loop operation. Multiple signals, including the $V_{FB}$ signal and all the LED voltage signals $V_{LED1}$ to $V_{LEDn}$, are fed back to the dual-loop amplifier 515. In this exemplary embodiment 500, the $V_{FB}$ signal is generated by a commonly used resistor divider network ($R_{FB1}$ and $R_{FB2}$).

The chain of shift registers 575 accepts a packet of data through a six-wire high-speed serial data interface, illustrated as SCKI, SDI, LDI, SCKO, SDO, and LDO. The chain of registers 575 is used to program internal dot correction registers (REG DC1 to REG DCn) and grayscale registers (REG GS1 to REG GSn). All such derived digital bits are then translated, by corresponding digital to analog converters (DACs) 560, 565, . . . , 570, to dot correction current signals ($I_{LED1}$ to $I_{LEDn}$) and grayscale PWM dimming signals ($PWM_1$ to $PWM_n$). The plurality of current sinks regulate the corresponding LED currents to the dot correction current value ($I_{LED1}$ to $I_{LEDn}$) and modulate their corresponding LED on/off times based on the grayscale PWM dimming signal ($PWM_1$ to $PWM_n$). In some embodiments, each current sink (550, 552, 555) regulates its own current independent of the LED voltage $V_{LED1}$ to $V_{LEDn}$, as long as the voltage is higher than the minimum required regulation value $V_{REF2}$.

The phase generator 540 in FIG. 5 sends out a digital signal PRECHG, dividing each PWM dimming cycle into two phases: a tracking phase (PRECHG=0) and a pre-charging phase (PRECHG=1). In some embodiments, the duration of the tracking phase is about 90% of the duration of a PWM dimming cycle or $T_{PWM}$. The duration of the pre-charging phase is about 10% of the duration of a PWM dimming cycle or $T_{PWM}$. To regulate the LED bus voltage $V_{OUT}$, a dual-loop amplifier 515 is employed in circuitry 500. The dual-loop amplifier 515 receives $V_{FB}$, $V_{LED1}$ to $V_{LEDn}$ signals, and two reference voltages $V_{REF1}$ and $V_{REF2}$, as inputs. $V_{FB}$ is generated based on the ratio of resistor 512 to resistor 517. $V_{LED1}$ to $V_{LEDn}$ correspond to the voltage levels after the forward voltage drop in each channel, respectively. The reference voltage generation circuit 535 can be any supply-, temperature-, noise-, and process-independent voltage reference circuit, like band-gap reference. The reference voltage generation circuit 535 provides two reference voltages $V_{REF1}$ and $V_{REF2}$ to the dual-loop amplifier 515. The $V_{REF2}$ is the minimum voltage needed to keep the multiple LED channels in regulation, and is determined by the current sink (550, 552, 555). A current sink cannot regulate its current when its LED voltage $V_{LED1}$ to $V_{LEDn}$ is lower than $V_{REF2}$. The $V_{REF1}$ can be any reasonable value between ground the LED bus voltage $V_{OUT}$.

Based on such input signals, the dual-loop amplifier 515 generates a voltage control ($V_C$) signal and sends it to the switching controller 502. The dual-loop amplifier 515 multiplies the input error signal between $V_{REF1}$ and $V_{FB}$ with a high gain factor K1 when PRECHG=1 (during the pre-charging phase) and multiplies the input error signal between $V_{REF2}$ and the minimum LED voltage among $V_{LED1}$ to $V_{LEDn}$ with another high gain factor K2 when PRECHG=0 (during the tracking phase) to generate the $V_C$ signal. When the overall system is in close loop, the $V_{FB}$ signal is regulated to $V_{REF1}$ when PRECHG=1 (during the pre-charging phase), and the minimum LED voltage among $V_{LED1}$ to $V_{LEDn}$ is regulated to $V_{REF2}$ when PRECHG=0 (during the tracking phase).

Figure 6:
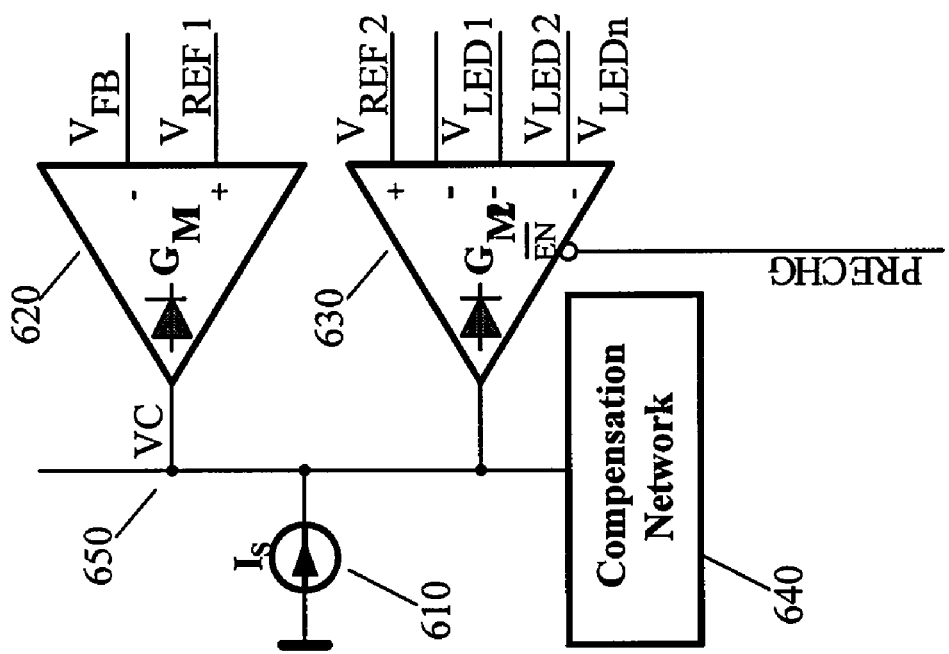
FIGS. 6-8 depict different exemplary circuits of a dual-loop amplifier, in accordance with an embodiment of the present teaching.
Figure 7:
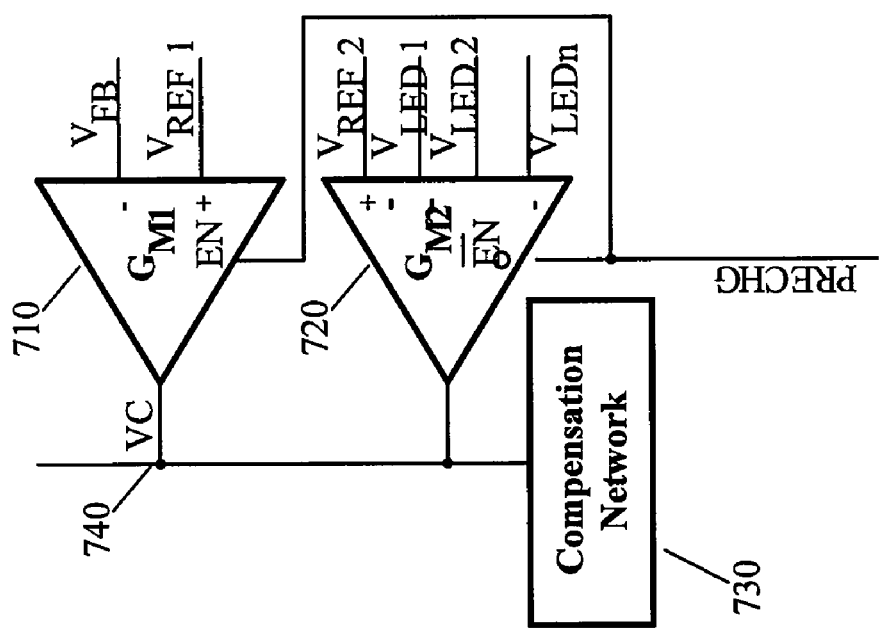
Figure 8:
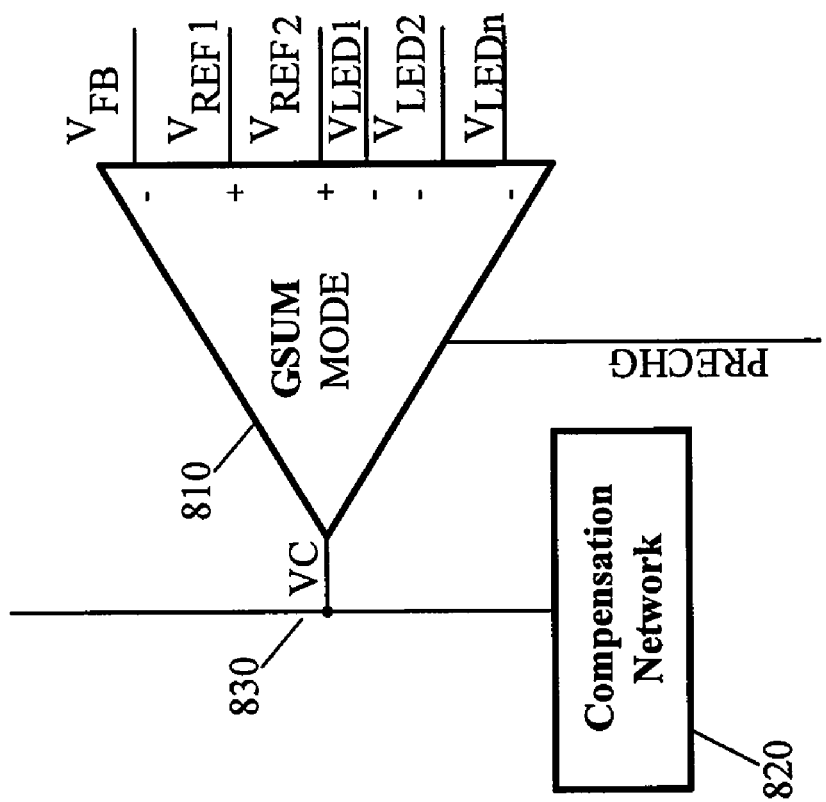

FIGS. 6-8 depict exemplary implementations of the dual-loop amplifier 515. In FIG. 6, one exemplary implementation of the dual-loop amplifier 515 comprises two error transconductance amplifiers ($G_{M1}$ 620 and $G_{M2}$ 630), a constant current source $I_s$ 610, and a compensation network 640. The amplifiers 620 and 630, as well as the current source 610 form a dual-loop analog "OR" control. The compensation network 640 connected to the $V_C$ node 650 aims at stabilizing the dual-loop control. The amplifier $G_{M1}$ 620 has its inverting input terminal connected to the resistor divider feedback node $V_{FB}$ in FIG. 5, its non-inverting input terminal connected to $V_{REF1}$ (e.g., 1.25V) from the reference voltage generator REF, and its output terminal to the $V_C$ node 650, thereby regulating the LED bus voltage to a preset constant value. The preset constant value for the regulated LED bus voltage is computed as follows:

$$V_{OUT(Preset)} = V_{REF1} \cdot \left(1 + \frac{R_{FB2}}{R_{RB1}}\right)$$

The amplifier $G_{M2}$ 630 has its inverting input terminals connected to all LED voltage $V_{LED1}$ to $V_{LEDn}$, its non-inverting input terminal connected to $V_{REF2}$ (e.g., 0.5V) from the reference voltage generator REF, and its output terminal to the $V_C$ node 650, thereby regulating the minimum active LED voltage to $V_{REF2}$ and generating an adaptive LED bus voltage. The adaptive value for the regulated LED bus voltage is computed as follows:

$$V_{OUT(Adaptive)} = V_{REF2} + \max(V_{F(active)}),$$

where $V_{F(Active)}$ corresponds to the active LED string forward voltage drop. The PRECHG signal from the phase generator can enable and disable the amplifier $G_{M2}$ 630.

Both the $G_{M1}$ 620 and $G_{M2}$ 630 can only sink current from the $V_C$ node 650. In addition, since the additional current source $I_S$ charges up the $V_C$ node 650, together it forms a dual-loop analog "OR" control. The $V_{OUT}$ is regulated to $V_{OUT(Preset)}$ when PRECHG=1 or $V_{OUT(Adaptive)}$ when PRECHG=0. The voltage information $V_C$ at node 650, which reflects the deviation between the LED bus voltage and the desired regulation target, is fed to the switching controller 502 (FIG. 5), the form of which can be, but not limited to, voltage-mode, current-mode, hysteretic-mode, or sliding-mode controllers. Cooperating with an oscillator 507, the switching controller 502 generates a switch on/off signal and sends the switch on/off signal to a driver 505. The driver 505 buffers the switch on/off signal to drive the power switches within a power stage 510, thereby yielding a complete close loop system.

Another exemplary embodiment of the dual-loop amplifier 515 is depicted in FIG. 7. In this exemplary embodiment, the dual-loop amplifier comprises two error transconductance amplifiers $G_{M1}$ 710 and $G_{M2}$ 720, and a compensation network 730. Both amplifiers $G_{M1}$ 710 and $G_{M2}$ 720 can source and sink current to and from a $V_C$ node 740. The PRECHG signal enables $G_{M1}$ 710 when PRECHG=1 and $G_{M2}$ 720 when PRECHG=0.

Yet another exemplary embodiment of the dual-loop amplifier 515 is depicted in FIG. 8. In this exemplary embodiment, the dual-loop amplifier comprises a single summing amplifier $G_{SUM}$ 810 and a compensation network 820. The output generated by the summing amplifier $G_{SUM}$ 810 can be expressed as follows:

$$V_C = K_1 \cdot (V_{REF1} - V_{FB}) + K_2 \cdot (V_{REF2} - \min(V_{LED1}, V_{LED2}, \ldots, V_{LEDn}))$$

where $K_1$ and $K_2$ correspond to the gain factors for each error signals, respectively. The PRECHG signal actively changes the gain factors $K_1$ and $K_2$ to implement the function of the dual-loop amplifier 515.

Figure 9:
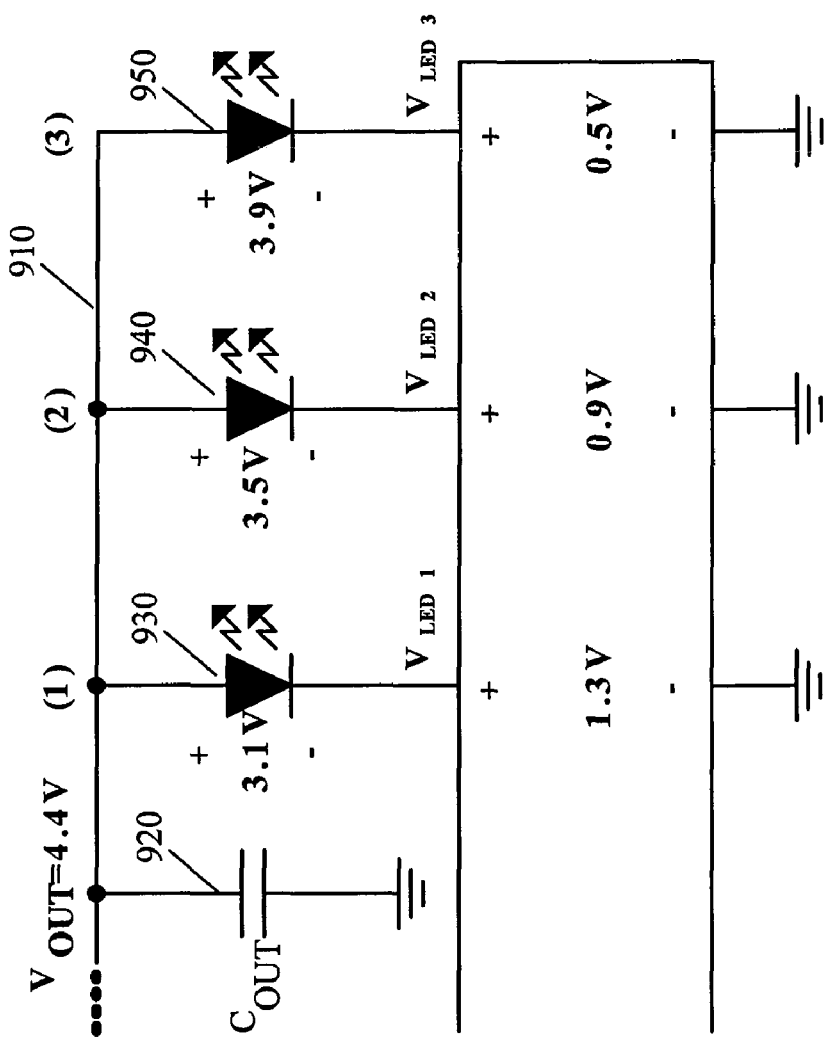
FIG. 9 depicts an application circuit with three-channel LED array with the same dot correction current and different grayscale PWM dimming, to explain an embodiment of the present teaching.

To better explain the operation of the exemplary embodiment as depicted in FIG. 5, an application system 900 with three-channel LED array, as shown in FIG. 9, is presented. It is understood that it is merely for illustration and discussion and not intended to limit the scope of the present teaching. Other parallel architectures may also be employed without deviating from the spirit of the present teaching. The exemplary architecture 900 comprises a three-channel LED array having the same dot correction current and different grayscale PWM dimming. Each channel is represented by a diode, channel 1 with diode 930, channel 2 with diode 940, and channel 3 with diode 950. The LED bus voltage 910 corresponds to $V_{OUT}$. There is a capacitor $C_{OUT}$ 920. In this exemplary structure, it is assumed that the LED forward voltage drops for channels 1, 2, and 3 are 3.1V, 3.5V, and 3.9V, respectively.

Figure 10:
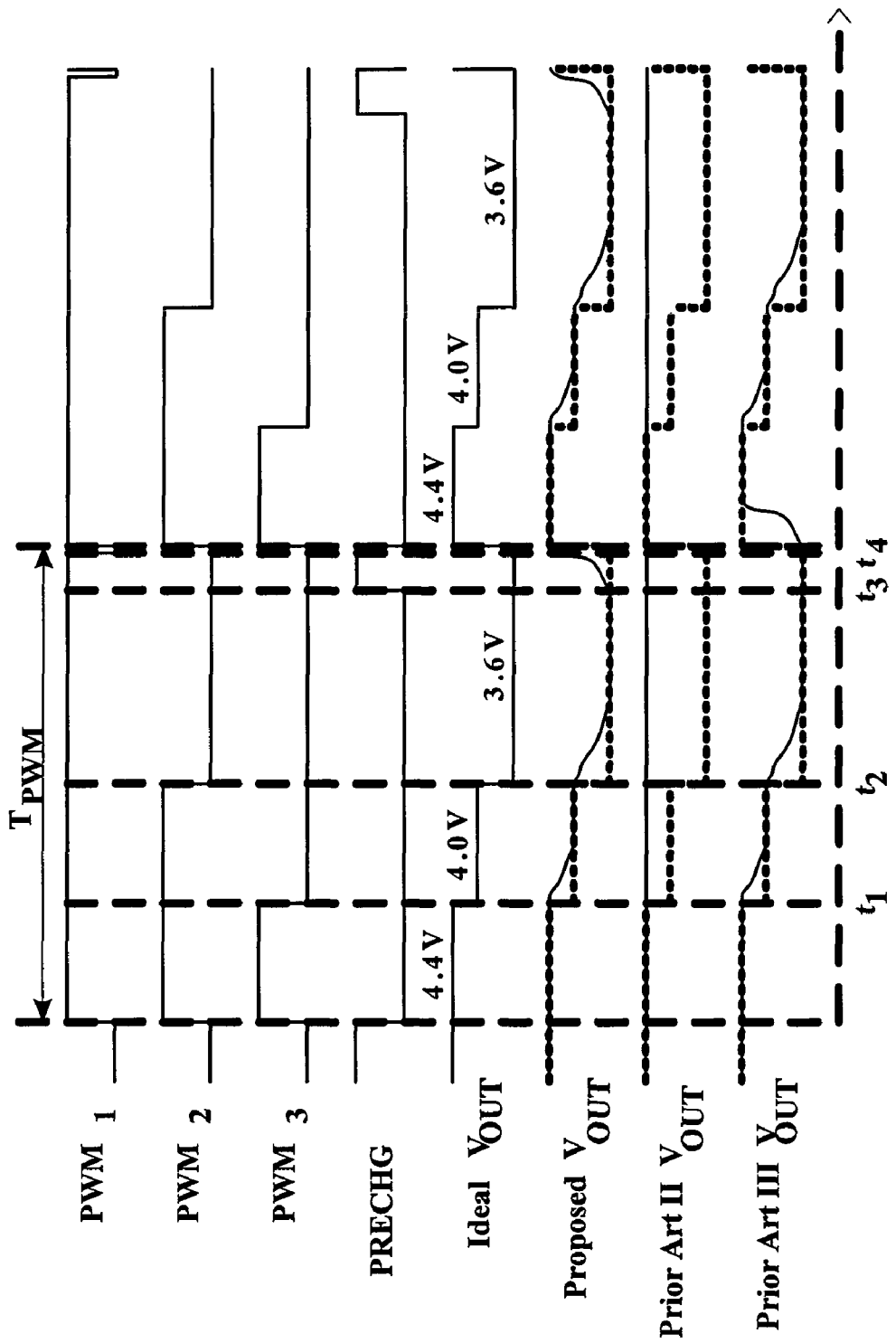
FIG. 10 shows $V_{out}$ waveforms to illustrate performance enhancement of the present teaching.

The internally generated PWM dimming signals $PWM_1$, $PWM_2$, and $PWM_3$ shown in FIG. 10 are synchronized to the same PWM clock signal with different duty cycles. At the same time, a PRECHG signal with the same period $T_{PWM}$ is also generated, dividing each PWM dimming cycle into a tracking phase when PRECHG=0 and a pre-charging phase when PRECHG=1. For a given $V_{REF2}$ equal to 0.5V, the adaptive LED bus voltage $V_{OUT(Adaptive)}$ moves between 4.4V and 3.6V, and the preset LED bus voltage $V_{OUT(Preset)}$ is to be set to 4.4V at least.

At the beginning of each PWM cycle, all three LED channels (930, 940, and 950) are turned on, and both amplifiers $G_{M1}$ and $G_{M2}$ are enabled (when the dual-loop amplifier 515 is implemented as shown in FIG. 6). The dual-loop analog "OR" control gives the control to amplifier $GM_2$. When PRECHG=0, the minimum active LED pin voltage, i.e., $V_{LED3}$, is regulated to 0.5V, forcing the LED bus voltage $V_{OUT}$ to be 4.4V. Subsequently, at a certain time instance (say $t_1$), if the third channel 950 is turned off, the minimum active LED pin voltage is equal to 0.9V, which is the voltage drop of the second channel 940. Compared with the regulation target of 0.5V, it slowly brings the LED bus voltage $V_{OUT}$ down to 4.0V. Similarly at the next time instant (say $t_2$), the LED bus voltage is lowered to 3.6V. In this manner, the adaptive nature of the circuit according to the present teaching enables to track the states of each channel and, thus, eliminates unnecessary power dissipation across the LED driver and yields superior system efficiency.

When PRECHG=1 at a different time instant (say $t_3$), the amplifier $G_{M2}$ is disabled so that only amplifier $G_{M1}$ regulates the LED bus voltage toward a preset highest value, 4.4V. As long as the time interval when PRECHG=1 is longer than the required time to charge the LED bus voltage from 3.6V to 4.4V, an extremely short minimum LED on time for the next PWM cycle is ensured.

Figure 1:
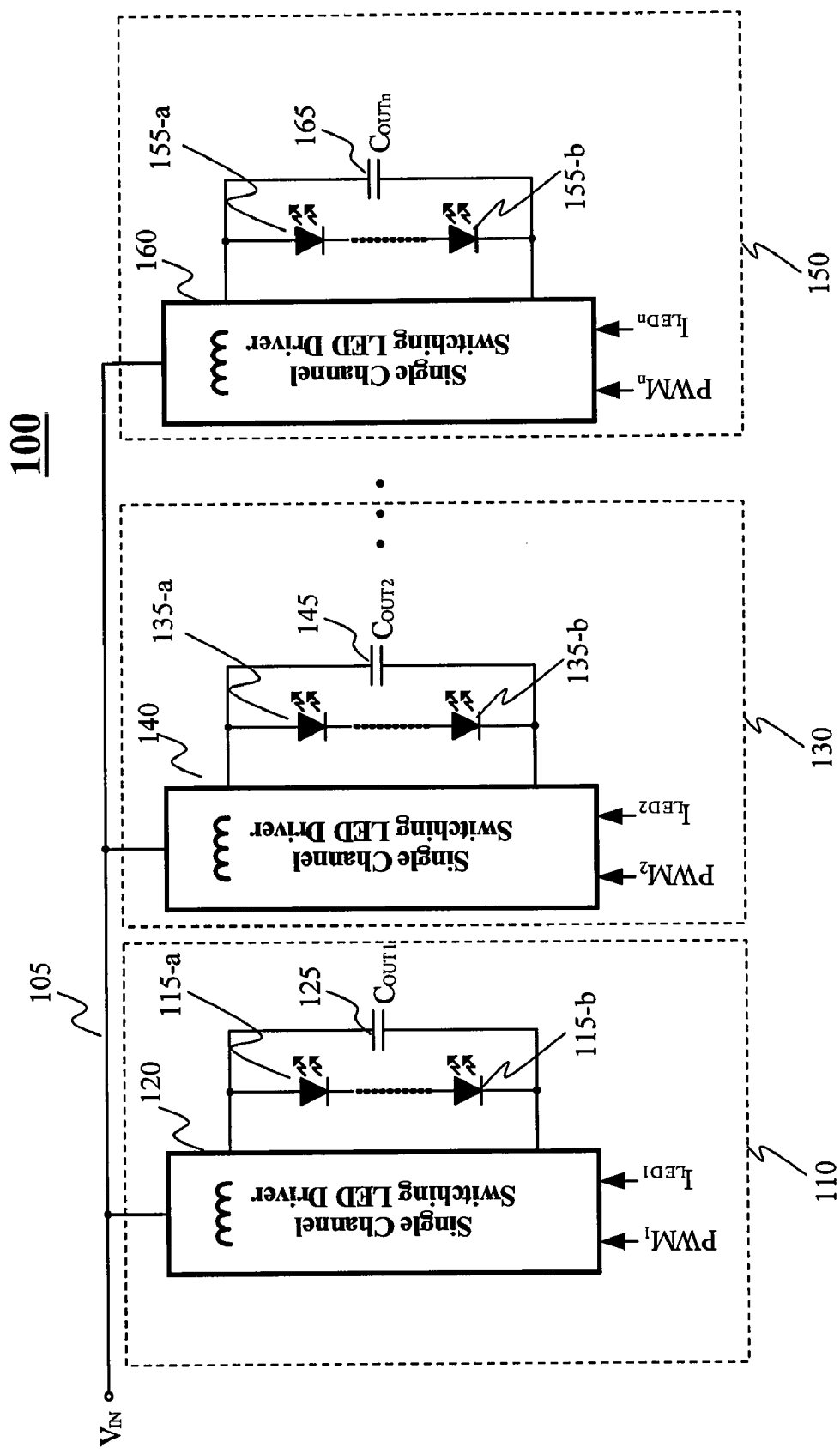
FIG. 1 (Prior Art) illustrates a circuit with separate switching regulators driving multiple channels of LEDs.
Figure 2:
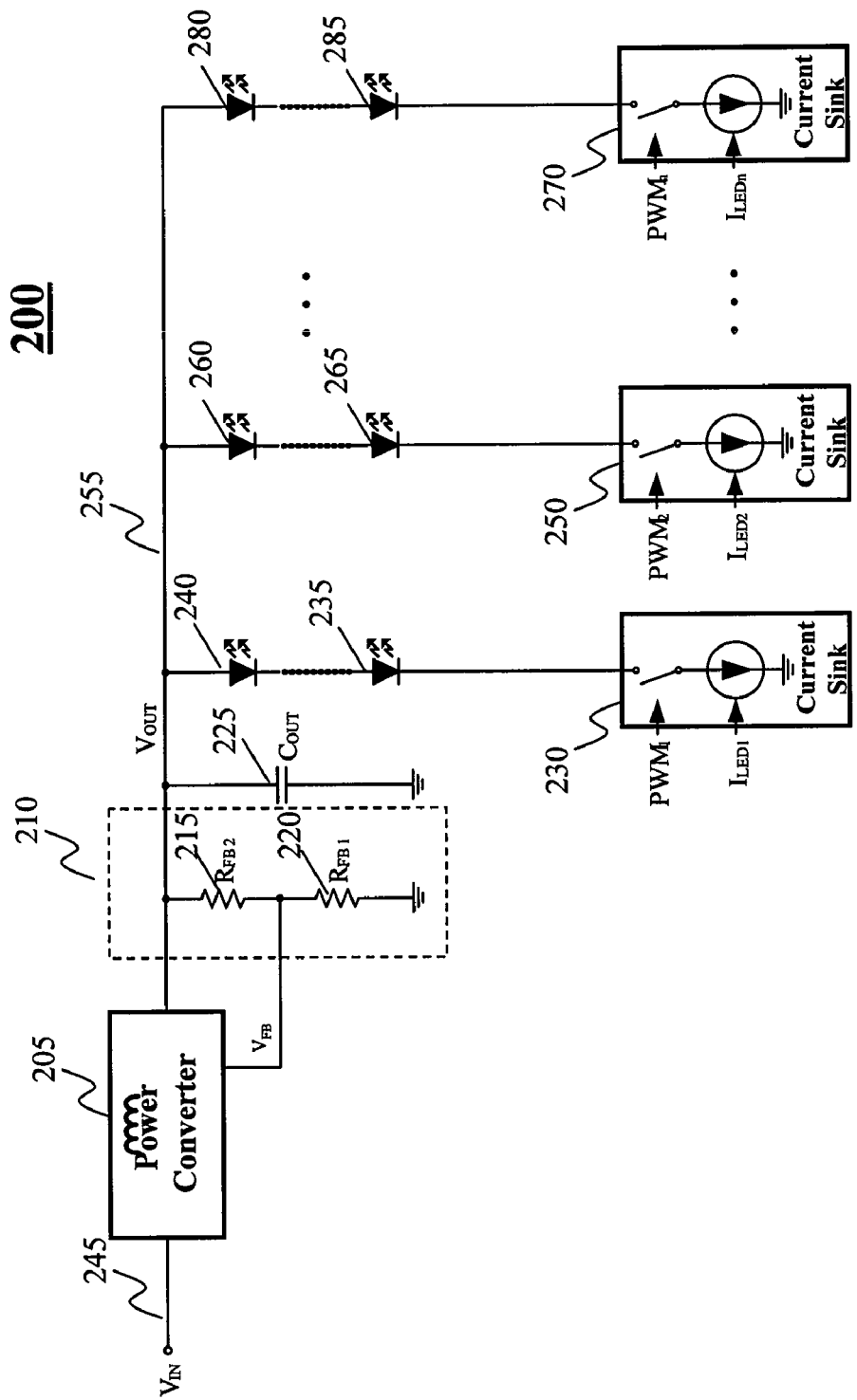
FIG. 2 (Prior Art) illustrates a circuit with an independent power converter combined with multiple linear current sinks to drive multiple channels of LEDs.
Figure 3:
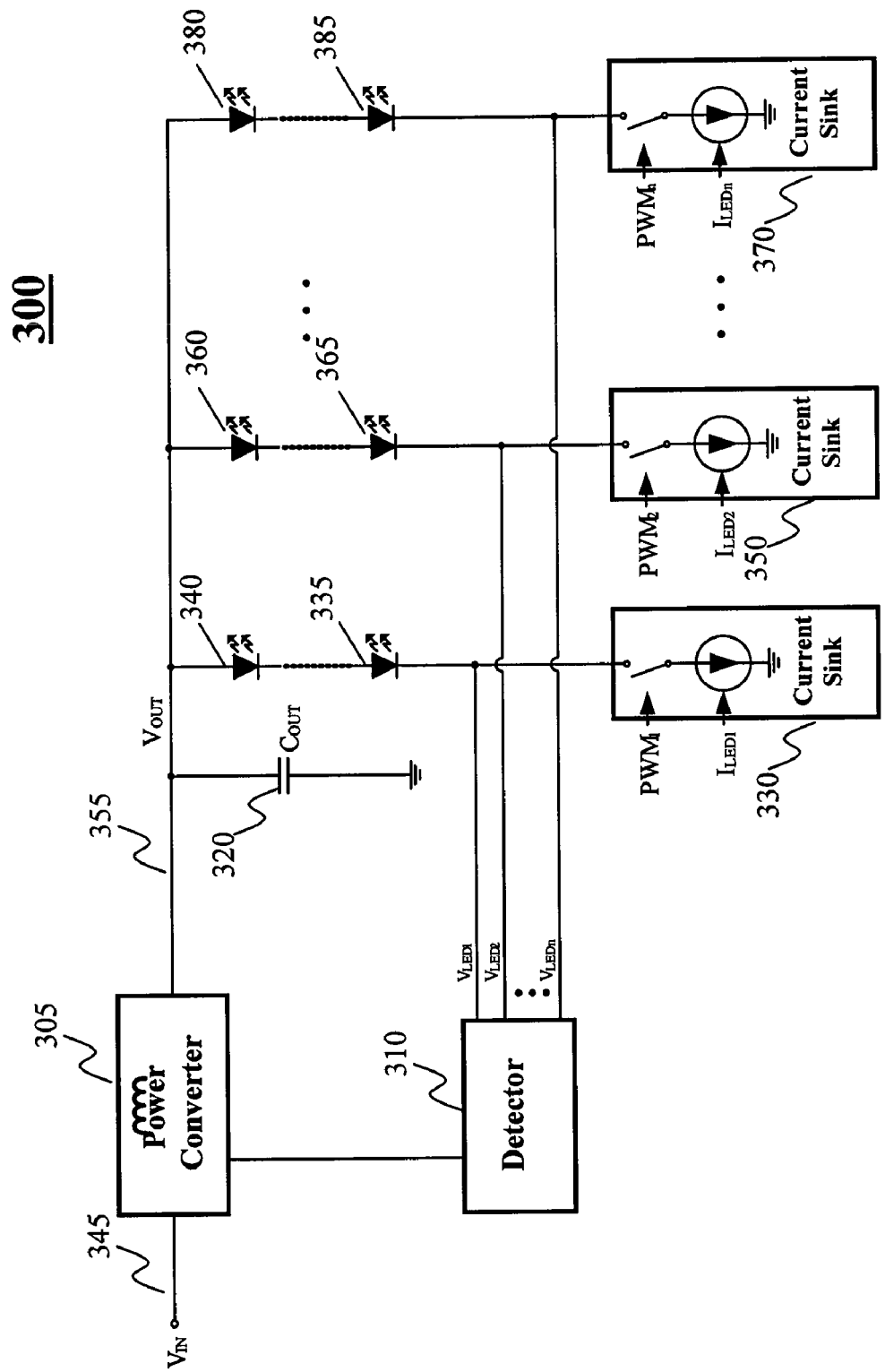
FIG. 3 (Prior Art) illustrates a circuit with an adaptive power converter combined with multiple linear current sinks to drive multiple channels of LEDs.

FIG. 10 presents a comparison between performance of prior art circuitries and that of the circuitry proposed based on the present teaching. From the top of the FIG. 10, the first three curves represent PWM signals used to control three LED channels in FIG. 9. The fourth curve represents the PRECHG signal. The fifth curve represents the ideal scenario which has sharp rising and falling edges. The sixth curve represents the performance of the proposed exemplary circuitry in FIG. 5, measured with respect to $V_{OUT}$. The remaining two curves represent the performance of the prior art solutions, as depicted in FIG. 2 and FIG. 3. It can be seen that the adaptive-tracking-plus-pre-charging technique according to the present teaching achieves, at the same time, both high efficiency and fast transient in a cost-effective parallel architecture when compared with that of the existing solutions. In addition, the exemplary embodiments as discussed herein with high efficient and fast transient properties correspond to implementations as a monolithic semiconductor chip suitable for use of LEDs having wide forward voltage variations.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

We claim:

1. A light emitting diode (LED) driver for supplying an LED bus voltage to a large array of LEDs organized in multiple channels with one or more LEDs connected in series in each channel, comprising:
 a power converter configured for providing the LED bus voltage to the multiple LED channels based on a voltage control signal;
 a feedback generation circuit configured for generating a feedback signal based on the LED bus voltage supplied to the multiple LED channels; and
 a phase-division based controller configured for generating the voltage control signal based on the feedback signal and information from the multiple LED channels, wherein
 the phase-division based controller divides each pulse width modulation (PWM) dimming cycle associated with each channel into a tracking phase and a pre-charging phase, and
 the LED bus voltage supplied to the multiple channels changes between the tracking phase and the pre-charging phase.

2. The LED driver according to claim 1, wherein:
 during the tracking phase, the phase-division based controller controls, via the voltage control signal, the power converter to generate a LED bus voltage that is a minimum value needed to keep the multiple LED channels in regulation; and
 during the pre-charging phase, the phase-division based controller controls, via the voltage control signal, the power converter to generate a LED bus voltage that is regulated towards a preset constant value.

3. The LED driver according to claim 1, wherein the feedback generation circuit comprises serially connected feedback resistors.

4. The LED driver according to claim 3, wherein the LED bus voltage is programmed during the pre-charging phase through the feedback generation circuit to a preset constant value.

5. The LED driver according to claim 4, wherein the preset constant value is determined based on a ratio of the first to the second feedback resistors.

6. The LED driver according to claim 1, wherein the power converter comprises:
 a switching controller configured for switching between a first voltage level and a second voltage level and producing a switched voltage level based on the voltage control signal;
 a driver configured for generating a signal that drives the power converter to generate the LED bus voltage based on the switched voltage level; and
 a power stage configured for generating the LED bus voltage based on the signal from the driver.

7. The LED driver according to claim 1, the phase-division based controller comprises:
 a phase generator configured for dividing a pulse width modulation (PWM) dimming cycle into the tracking and pre-charging phases and generating a phase signal representing the tracking and pre-charging phases, respectively;
 a reference voltage generation circuit configured for generating a first reference voltage and a second reference voltage; and
 a dual-loop amplifier configured for generating the voltage control signal based on the phase signal, the feedback signal, the first and second reference voltages, and voltages after forward voltage drops from the multiple channels.

8. The LED driver according to claim 7, wherein the dual-loop amplifier comprises:
 a first error transconductance amplifier having its inverting input terminal connected to the feedback signal, its non-inverting input terminal connected to a first reference voltage, and its output terminal coupled to the voltage control signal, to generate an LED bus voltage of a preset constant value;
 a second error transconductance amplifier having its inverting input terminals connected to receive voltages measured after forward drops of the multiple channels, its non-inverting input terminal connected to a second reference voltage, and its output terminal to the voltage control signal, to generate an adaptive LED bus voltage based on the phase signal;
 a constant current source configured to charge the voltage control signal; and
 a compensation network coupled to the voltage control signal, wherein
 the first and second error transconductance amplifiers together with the constant current source form a dual-loop analog "OR" control, and
 the compensation network is operative to stabilize the dual-loop control.

9. The LED driver according to claim 7, wherein the dual-loop amplifier comprises:
 a first error transconductance amplifier having its inverting input terminal connected to the feedback signal, its non-inverting input terminal connected to a first reference voltage, and its output terminal coupled to the voltage control signal, to generate an LED bus voltage of a preset constant value based on the phase signal;
 a second error transconductance amplifier having its inverting input terminals connected to receive voltages measured after forward drops of the multiple channels, its non-inverting input terminal connected to a second reference voltage, and its output terminal to the voltage control signal, to generate an adaptive LED bus voltage based on the phase signal; and
 a compensation network coupled to the voltage control signal and configured for stabilizing the dual-loop control.

10. The LED driver according to claim 7, wherein the dual-loop amplifier comprises:
 a summing amplifier configured for generate the voltage control signal based on the feedback signal, the phase signal, the first and second reference voltages, and voltages measured after forward drops of the multiple channels; and
 a compensation network configured for stabilizing the dual-loop control.

11. A method for a light emitting diode (LED) driver that supplies an LED bus voltage to a large array of LEDs organized in multiple channels with one or more LEDs connected in series in each channel, comprising the steps of:
 providing the LED bus voltage to the multiple LED channels based on a voltage control signal; and
 generating a feedback signal based on the LED bus voltage supplied to the multiple LED channels, wherein
 the voltage control signal is generated based on the feedback signal and information from the multiple LED channels, each pulse width modulation (PWM) dimming cycle associated with each channel is divided into a tracking phase and a pre-charging phase, and the LED bus voltage supplied to the multiple channels changes between the tracking phase and the pre-charging phase.

12. The method according to claim 11, wherein:

during the tracking phase, generating a LED bus voltage that is at a minimum value needed to keep the multiple LED channels in regulation; and during the pre-charging phase, generating a LED bus voltage that is regulated towards a preset constant value.

13. The method according to claim 11, wherein the feedback signal is generated based on a ratio of a first feedback resistor to a second feedback resistor that are serially connected to the LED bus voltage.

14. The method according to claim 13, wherein the preset constant value during the pre-charging phase is determined based on the ratio of the first to the second feedback resistors.

15. The method according to claim 11, wherein the LED bus voltage is generated via the following steps:

switching between a first voltage level and a second voltage level to produce a switched voltage level based on the voltage control signal;

generating a signal that controls generation of the LED bus voltage based on the switched voltage level; and generating the LED bus voltage based on the signal from the driver.

16. The method according to claim 11, wherein generating the voltage control signal comprises the steps of:

dividing a pulse width modulation (PWM) dimming cycle associated with each channel into the tracking and pre-charging phases;

generating a phase signal having values representing the tracking and pre-charging phases, respectively;

generating a first reference voltage and a second reference voltage; and generating the voltage control signal based on the phase signal, the feedback signal, the first and second reference voltages, and voltages after forward voltage drops from the multiple channels.

17. A communication device having a light emitting diode (LED) display driven by an LED driver, comprising:

an LED display having a large array of LEDs organized in multiple channels with one or more LEDs connected in series in each channel; and an LED driver coupled to the LED display to supply an LED bus voltage to the multiple channels, wherein the LED driver comprises:

a power converter configured for providing the LED bus voltage to the multiple LED channels based on a voltage control signal;

a feedback generation circuit configured for generating a feedback signal based on the LED bus voltage supplied to the multiple LED channels; and a phase-division based controller configured for generating the voltage control signal based on the feedback signal and information from the multiple LED channels, wherein the phase-division based controller divides each pulse width modulation (PWM) dimming cycle associated with each channel into a tracking phase and a pre-charging phase, and the LED bus voltage supplied to the multiple channels changes between the tracking phase and the pre-charging phase.

* * * * *